United States Patent [19]

Sciacero et al.

[11] Patent Number: 5,539,321
[45] Date of Patent: Jul. 23, 1996

[54] APPARATUS FOR MEASURING THE CROSSTALK IN A CABLE

[75] Inventors: James R. Sciacero, Scottsdale; John P. Hittel, Phoenix, both of Ariz.

[73] Assignee: Microtest, Inc., Phoenix, Ariz.

[21] Appl. No.: 570,660

[22] Filed: Dec. 11, 1995

Related U.S. Application Data

[63] Continuation of Ser. No. 943,724, Sep. 11, 1992, Pat. No. 5,502,391.

[51] Int. Cl.[6] .................................................. H01H 31/04
[52] U.S. Cl. .......................... 324/628; 324/540; 324/684; 324/73.1
[58] Field of Search ..................... 324/669, 683, 324/628, 73.1, 540, 684, 66

[56] References Cited

U.S. PATENT DOCUMENTS

| | | | |
|---|---|---|---|
| 3,678,379 | 7/1972 | Arvay | 324/616 |
| 3,873,927 | 3/1975 | Overall | 324/684 |
| 3,882,381 | 5/1975 | Gregory | 324/684 |
| 3,986,110 | 10/1976 | Overall | 324/684 |
| 4,634,964 | 1/1987 | Chattler | 324/628 |

*Primary Examiner*—Kenneth A. Wieder
*Assistant Examiner*—Jose M. Solis
*Attorney, Agent, or Firm*—Snell & Wilmer

[57] ABSTRACT

An instrument to measure crosstalk between conductor pairs is configured to transmit a signal at one pair and receive the signal at another pair. The spureous or parasitic crosstalk at the connectors is supressed using a vectorial substraction from the received signal.

7 Claims, 7 Drawing Sheets

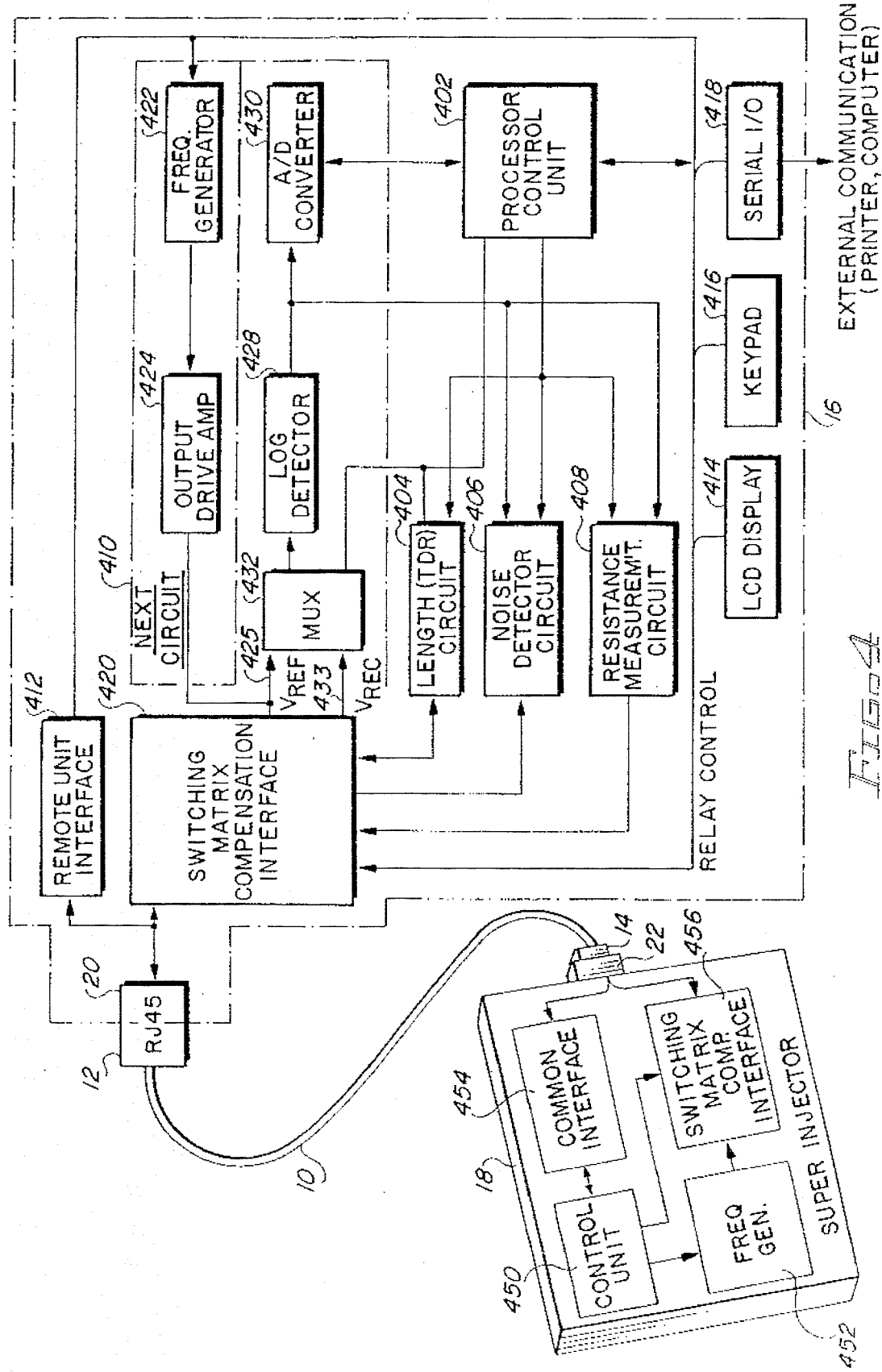

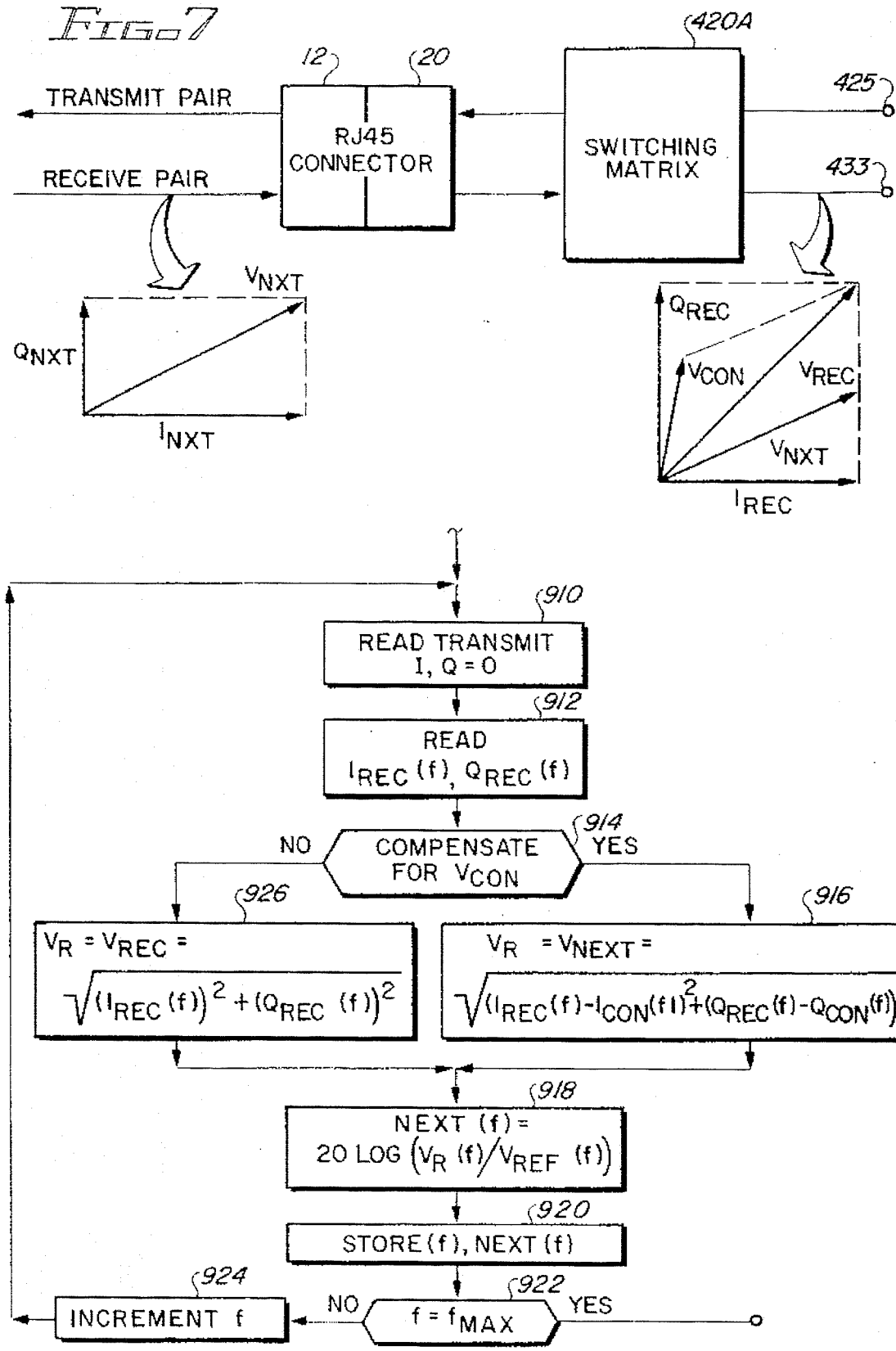

APPARATUS FOR MEASURING THE CROSSTALK IN A CABLE

This is a continuation of Ser. No. 07/943,724 filed on 11 Sep. 1992, now U.S. Pat. No. 5,502,391.

FIELD OF THE INVENTION

The present invention relates, in general, to devices for testing and certifying multi-conductor cables commonly utilized in data communication systems, such as, for example, local area networks (LANs), and in particular to devices for measuring the near-end crosstalk (commonly referred to as NEXT) between the respective conductor pairs of the cable.

BACKGROUND OF THE INVENTION

As data communication systems such as a plurality of individual computers interconnected by a local area network (LAN) become prevalent in the business place, and increase in speed of data transmission and sophistication, the nature of the cable employed in the communication network becomes more and more critical. Many such networks employ unshielded twisted pair (UTP) cable including four pairs of conductors, terminated at each end in standard eight pin modular jack (commonly referred to as RJ45 connectors). Successful operation of high-speed data communication networks employing such UTP cable is dependent upon the quality of the cable and the manner in which it is installed. Standards are being developed to classify cable based upon the near-end crosstalk (NEXT) and attenuation characteristics of the cable. Such parameters, in conjunction with the length of cable, tend to dictate the steady state signal to noise ratios attainable by the system, and the ability of the cable to accommodate the various forms of high-speed data transmission. Near-end crosstalk performance of the cable is a measure of how much signal is coupled from one pair of transmit conductors to receive conductors in the same sheath, when both the transmitter and receiver are located at the same (near) end.

Data Communication Systems employing local area networks typically are full duplex systems; transmission and reception by a unit in the system will occur simultaneously, transmission being provided as a balanced differential signal on a first signal pair, (the transmit pair) and receiving a balanced differential signal on a second cable pair (the receive pair). Near-end crosstalk from the transmit pair to the receive pair, is perceived by the unit as noise, and denigrates system performance. Attenuation is a measure of the decrease in amplitude of signals as they propagate through a length of cable.

The near-end crosstalk performance of a cable is typically measured by injecting a reference transmit signal (test signal) on the near-end of a designated set of conductors, and detecting the amount of test signal present at the near-end cable on the other sets of conductors. This test is typically performed with the cables under test terminated in their characteristic impedance. The NEXT parameter is frequency dependent, and the test is conducted over a range of frequencies, for example, from 200 Khz to 100 Mhz.

Attenuation is measured by injecting a reference signal into a conductor pair, and measuring the decrease in amplitude in the signal received at a second point in the cable. In more sophisticated systems, the signal is injected into a twisted pair at the far end of the cable, and the attenuation measurement made at the cable near-end. Other less sophisticated systems, tend to employ what is referred to as a "loop back" method wherein the individual conductors of two twisted pairs are interconnected at the far-end, and the reference signal is injected at the near-end of one pair, and received at the near-end of the other pair. A measurement is thus made of the cumulative attenuation of the two pairs.

In many instances, it is necessary to certify whether new or existing wiring meets manufacturer specifications, or determine whether existing wiring can accommodate higher speed operation, or different communication protocol, e.g., determine if an existing UTP cabling employed in a 4 megabyte token ring system can support a 16 megabyte token ring, 10BASE-T or ARCNET network application. NEXT and attenuation measurements are required for this cable certification process.

In general, devices for testing UTP cable are known. For example, the commercially available Microtest MT-340 scanner automatically effects a series of tests on cable to certify whether or not new or existing cable will support various network applications. Such tests include, among other things, measurements of near-end crosstalk, cable length, signal attenuation and DC resistance. The MT-340 scanner engages the connector at the near end of the cable to be tested and a remote unit is connected to the far end of the cable. The remote unit, responsive to control signals provided by the MT-340 scanner through the cable, provides the appropriate termination of particular wire pair under test, or in the case of e.g., attenuation measurements, injects the appropriate signal at the far end of the cable. Measurement of near-end crosstalk between respective conductor pairs in the cable, in the MT-340 scanner system is affected as follows: the switching matrices, formed of relays in the MT-340 scanner employed to selectively couple the signal generating and receiving circuitry to respective sets of conductor pairs; commands are generated to the remote unit (which includes a switching matrix similar to that in scanner) to terminate the selected pairs in their characteristic resistance; a test signal of predetermined frequency is injected into one of the conductor pairs, and the coupled signal on the other pair are detected. The frequency of the test is incremented through a range of frequencies from 200 Khz to 20 Mhz to measure NEXT across the relevant frequency range. The crosstalk between the various pairs of the cable are measured in sequence; control signals are generated to the switching matrices to select the relevant sets of pairs.

It has now been determined, however, that a large component of the measured near-end crosstalk is due to the RJ45 connector. The NEXT performance criteria for cables used in high speed data communication networks is now exceeding the crosstalk performance of the connector system. This is particularly true with respect to cables meeting high level standards (e.g., UL LEVEL 5 cable); the crosstalk effected in the connector is sufficiently greater than the cable near-end crosstalk so as to mask the cable crosstalk, and make it unmeasurable by conventional test equipment. Examples of high performance cable specifications for NEXT are −56 dB at 16 Mhz. The typical NEXT performance of a mated RJ45 connector on certain pairs is −43 dB. If such connector crosstalk is not canceled, the test equipment will not be able to certify that the cable meets the required −56 dB NEXT specifications. The crosstalk from the connector overwhelms the crosstalk on the cable media and severely limits the measurement capability of the test equipment to the crosstalk performance of the connector. Indeed, when testing through connectors, accurate NEXT characteristics of the high performance cable can not be obtained by conventional test apparatus due to the limitations of the connector system. This is problematical; the objective of cable certification test equipment is to determine that the cable media per se; meets predefined characteristics (e.g., UL cable grades). The UL cable grading specifications relate to the cable media per se; connector effects are not provided or accounted for in the specifications. Therefore, it is highly desirable to implement some methodology in cable certification test equipment which cancel or eliminates connector crosstalk. This would then allow certification of high performance cable in a typical installation environment, i.e., terminated in a standard RJ45 modular jack.

SUMMARY OF THE INVENTION

In accordance with one aspect of the present invention, near-end crosstalk attributable to the near-end connector is canceled to provide an accurate measurement of the near-end crosstalk parameter cable and in particular cable that has already been installed.

In accordance with another aspect of the present invention, it has been determined that the primary source of crosstalk in a terminated connector system is an unbalance in the differential capacitance between conductor pairs, and by forcing a balance in the differential capacitance between the conductors, crosstalk can be minimized.

In accordance with another aspect of the present invention, compensation capacitors are selectively coupled between the appropriate transmit/receive phases under test.

In accordance with another aspect of the present invention, near-end crosstalk attributable to the near-end connector is canceled by predetermining and storing indicia of the in-phase and quadrature components of connector crosstalk, and performing a vector subtraction from the received signal.

BRIEF DESCRIPTION OF THE DRAWING

Preferred exemplary embodiments of the present invention will hereinafter be described in conjunction with the appended drawing, wherein like designations denote like elements and:

FIG. 4 is a block schematic of a suitable cable testing apparatus;

FIG. 7 is a block schematic illustration of the vector components of the cable crosstalk and received signals;

FIG. 9 is a flow chart illustrating the operation of the circuit of FIG. 8.

DETAILED DESCRIPTION OF THE PREFERRED EXEMPLARY EMBODIMENT

Figure 1:
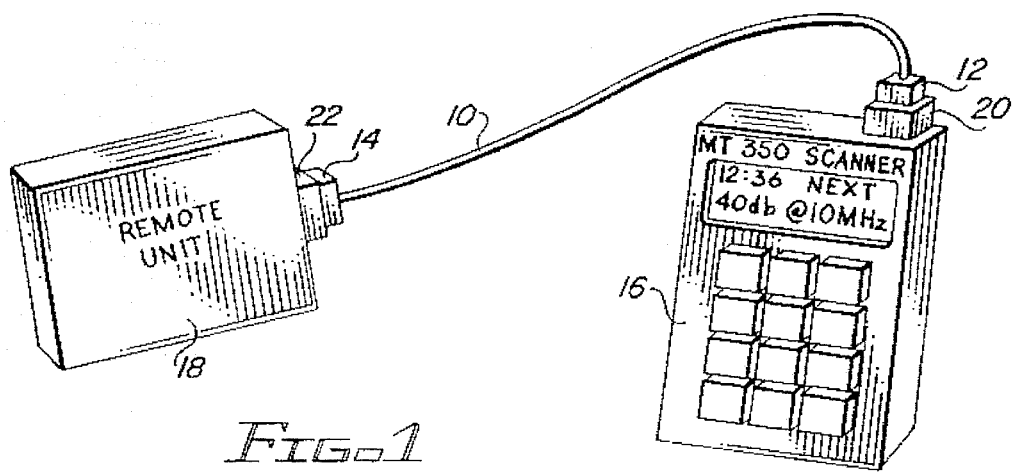
FIG. 1 is a schematic pictorial illustrating a cable testing environment.
Figure 2:
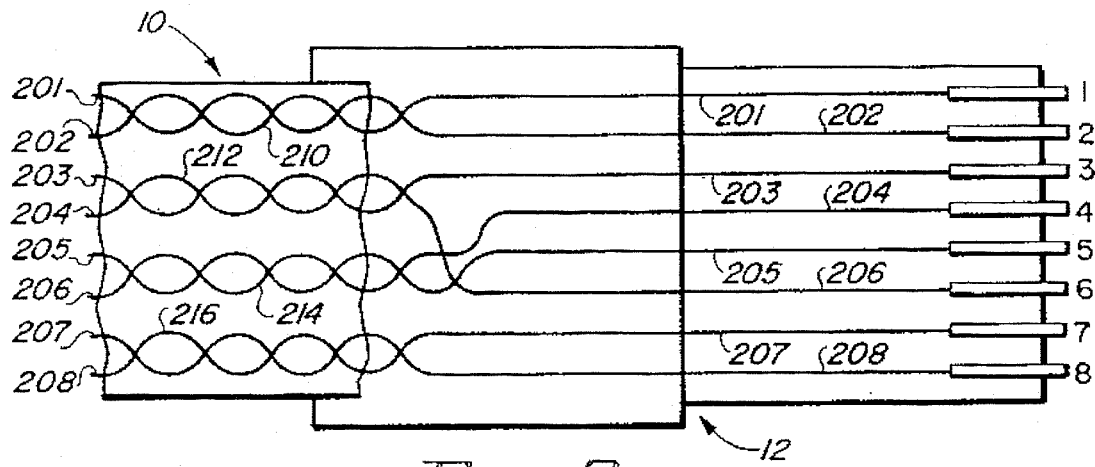
FIG. 2 is a schematic diagram of an unshielded twisted pair (UTP) cable including four pairs of conductors, terminated in a standard RJ45 connector.

Referring to FIGS. 1 and 2, an unshielded twisted pair cable 10 in a communication system typically comprises a length of unshielded twisted pair cable from 20–330 feet, terminated at each end with e.g., standard male RJ45 connectors 12 and 14.

To test cable 10, a cable testing apparatus 16 and remote unit 18 are coupled to the near-end and far end of cable 10, respectively. More specifically, test apparatus 16 and remote unit 18 include correspondent (e.g., female) connectors 20 and 22, for engaging cable connectors 12 and 22. In the context of a data transmission system, signals are typically transmitted in unshielded twisted pair cable in a balanced full duplex differential fashion. As best seen in FIG. 2, cable 10 includes 8 conductors, 201–208, forming four twisted pairs, 210, 212, 214, and 216. Conductors 201–208 are connected to the respective terminals 201a–208a of connector 12, in a conventional manner. More specifically, in accordance with standard practices, to terminate a four-pair cable in a male RJ45 connector, the respective pairs of conductors are untwisted, and laid out in parallel and flattened, with the conductors reordered in accordance with the following pin assignments: conductors 101 and 102 of pair 210 are routed to pins 1 and 2 of connector 12; conductors 203 and 204 of pair 212 are routed to pins 3 and 6, respectively; conductors 205 and 206 of pair 214 are routed to pins 4 and 5, respectively; and conductors 207 and 208 of pair 216 are routed to pins 7 and 8. Routing is accomplished by inserting the respective conductors in channels formed in the plastic housing of connector 12. Thus, the relative disposition of the untwisted conductors tends to be standardized from connector to connector.

As previously noted, the present inventors have determined that crosstalk in a terminated connector system is a result of unbalance in the differential capacitance between conductor pairs. While a component of crosstalk is due to imbalance in inductive coupling effects, the capacitive coupling effects are the primary source of crosstalk. The imbalance in coupling between conductor pairs is caused primarily by the physical proximity of the conductors in the connectors, and in particular by the close physical proximity of the untwisted parallel conductors within connector 12.

The extent that there is coupling within the twisted cable, the coupling tends to be balanced, and thus perceived as a common mode signal (present in each conductor of the pair). Such common mode signals are eliminated through the differential signal detection techniques employed in the system. However, within the connector, due to the physical proximity of the untwisted parallel conductors, the signal from a conductor is coupled into the conductors of other pairs in unequal amounts (i.e., unbalanced coupling is encountered). Such crosstalk, since unbalanced, is not perceived as common mode signals, and instead is perceived as deleterious noise. However, since the crosstalk is in large part dictated by the physical disposition of the conductors, which is in turn dictated by the standardized physical attributes of the connector, the crosstalk generated within the connector tends to be the same from connector to connector.

Figure 3A:
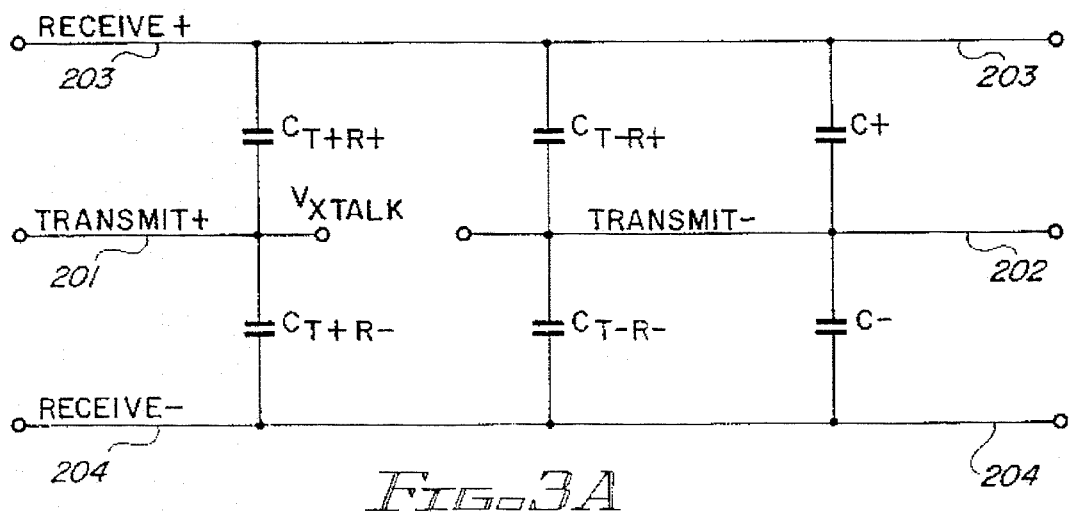
FIG. 3A is a schematic illustration of a distributed capacitance bridge equivalent of crosstalk between two pairs of conductors.

Referring now to FIG. 3A, crosstalk between two pairs of conductors can be modeled as a capacitance bridge, with capacitance distributed between the transmit plus and receive plus conductors ($C_{T+R+}$), the transmit plus and receive minus conductors ($C_{T+R-}$), the transmit minus and receive plus conductors ($C_{T-R+}$) and between the transmit minus and receive minus conductors ($C_{T-R-}$). When the ratios of capacitance in the respective legs of the bridge are equal, the crosstalk approaches zero:

$$C_{T+R+}/C_{T-R+}=C_{T+R-}/C_{T-R-}$$

The zero crosstalk condition can be approached by the addition of a crosstalk cancellation capacitor (C+ or C−) in FIG. 3A to achieve the requisite balance in differential capacitance. Adding capacitance to balance the differential capacitance, in effect, injects an out-of-phase signal to cancel the crosstalk.

However, in high speed data communication networks, crosstalk occurs between a plurality of pairs of conductors. For example, the standard pair combinations for which NEXT is to be measured on a standard RJ45 modular jack are:

TABLE 1

| TRANSMIT PAIR | RECEIVE PAIR |
| --- | --- |
| Pins 1,2 | Pins 3,6 |
| Pins 1,2 | Pins 4,5 |
| Pins 1,2 | Pins 7,8 |
| Pins 3,6 | Pins 4,5 |
| Pins 3,6 | Pins 7,8 |
| Pins 4,5 | Pins 7,8 |

Figure 3B:
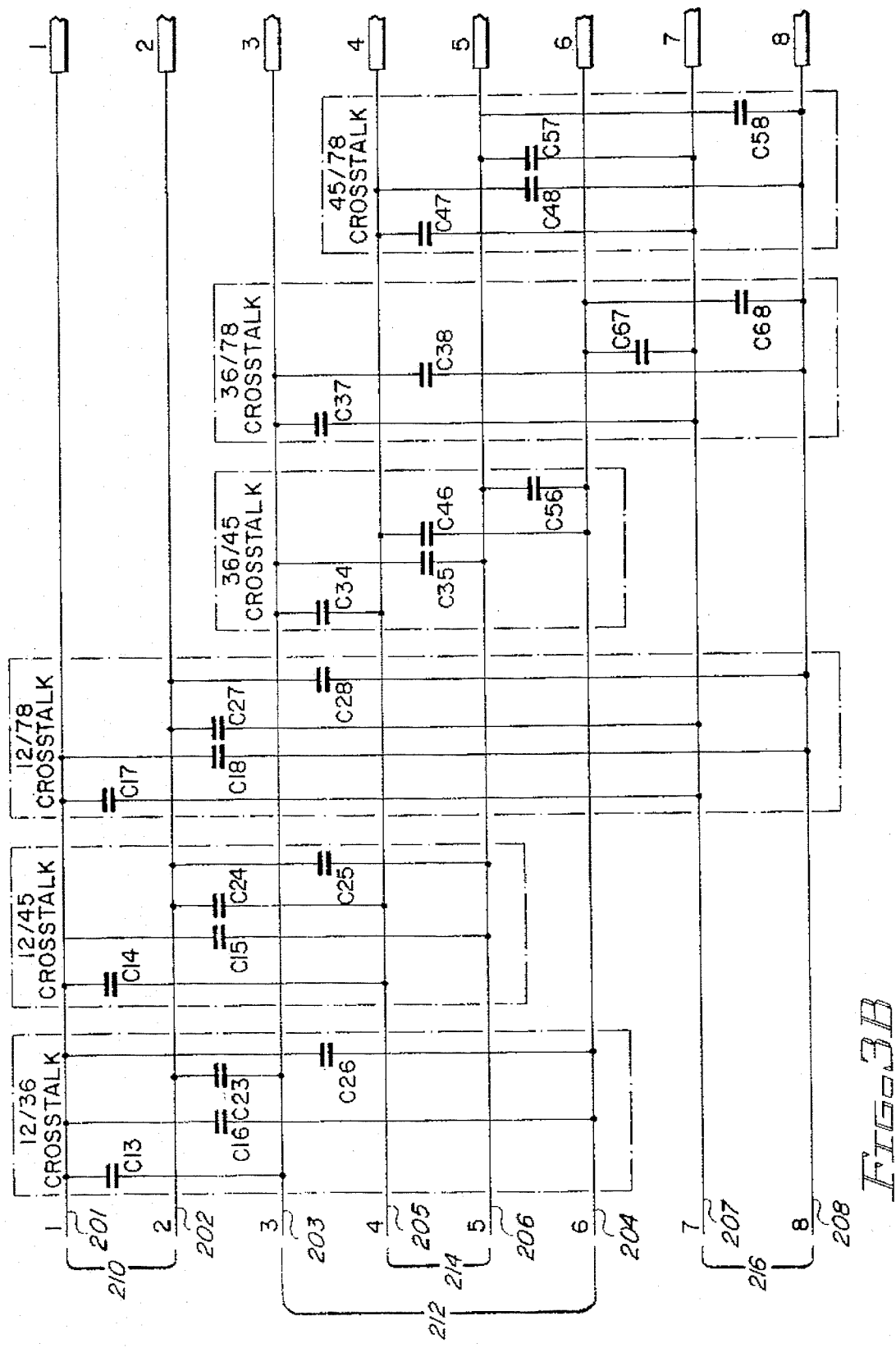
FIG. 3B is a schematic diagram illustrating the crosstalk equivalent capacitance bridges between the respective conductors in an RJ45 connector.
Figure 3C:
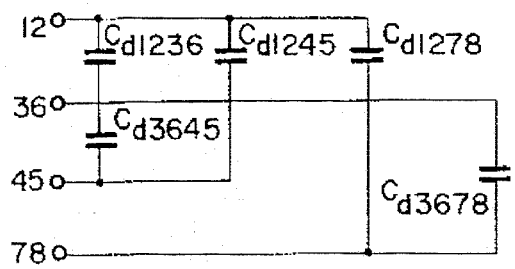
FIG. 3C is a simplified schematic of the equivalent circuit of FIG. 3B.

Thus, as shown schematically in FIG. 3B, there are six different capacitive bridges to be balanced. A simplified schematic showing the respective pairs as single conductors and the respective distributed capacitances between the individual conductors as a single capacitance (e.g., capacitors $C_{13}$, $C_{16}$, $C_{23}$, and $C_{26}$ are shown as a single capacitor $C_{d12,36}$ in FIG. 3C). Thus, when, in practice, multiple pairs are considered, the cancellation of crosstalk by addition of a cancellation capacitor between respective conductor pairs is complicated by interactive effects between cancellation paths. For example, interposing a cancellation capacitor into the pins 1,2/3,6 bridge, will effect the balancing of the bridge between pins 1,2 and 4,5 since there is also a capacitive coupling between pins 3,6 and pins 4,5. The interaction between cancellation capacitors tends to make convergence on a set of compensation capacitors which will cancel crosstalk in all of the desired paths difficult. However, since the NEXT measurement involves only two conductor pairs at a time, the cancellation capacitors can be selectively switched into the operative circuit; by selectively enabling and disabling the crosstalk cancellation paths, each cancellation capacitor value can be made independent of any other.

Figure 3D:
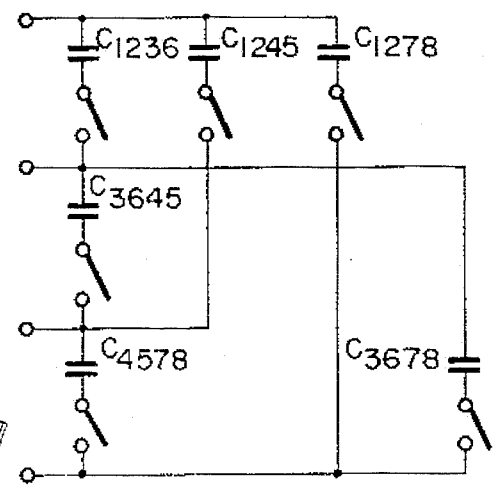
FIG. 3D is a simplified schematic of a switching matrix for providing selective connection of cancellation capacitors into the operative circuit.

A switching matrix for providing selective connection of the cancellation capacitors into the operative circuit is shown schematically in FIG. 3D. A cancellation capacitor corresponding the capacitive imbalance between each of the respective sets of conductor pairs is provided, together with an associated switch. Only the cancellation capacitance associated with the particular set of pairs under consideration is connected into the operative circuit. For example, when crosstalk between pins 1,2 (corresponding to conductor pair 210) and pins 3,6 (corresponding to conductor pair 212) is to be measured, only the cancellation capacitance C12/36 would be connected into the circuit; the switches associated with all of the other capacitances would remain open.

As will be more fully described, in accordance with another aspect of the present invention, the cancellation capacitors are integrated into relay matrices employed in test apparatus 16 and remote unit 18 to select the respective transmit and receive pairs under consideration for near-end crosstalk measurement.

Referring now to FIG. 4, test apparatus 16 suitably comprises a processor control unit 402 cooperating with: a conventional length measurement circuit 404; a conventional noise detection circuit 406; a conventional resistance measurement circuit 408; a suitable near-end crosstalk (NEXT) measurement circuit 410; a suitable remote unit interface circuit 412; a conventional display 414; a suitable key pad 416; a suitable input-output circuitry 418 for communication with external devices such as printers and computers; and in accordance with one aspect of the present invention, a crosstalk compensating interface 420.

Processor control circuit 402 suitably comprises a Hitachi 64180 microprocessor, and provides computational support and control to the various circuits of test unit 16. Length circuit 404, and resistance measurement circuit 308 are suitably of the type described in U.S. Pat. No. 4,970,466 issued to Bolles, et al, on Nov. 13, 1990.

Noise measurement circuit 406 is suitably a circuit for measuring steady state noise (0–1.0 volts rms) in various frequency bands (e.g., 60 Hz to 150 KHz, 150 KHz to 1 MHz, 1 MHz to 10 MHz, as is understood in the art).

NEXT measurement circuit 410 suitably generates a test signal ($V_{REF}$) at terminal 425 for transmission on a selected transmit pair, receives at terminal 433 a received signal ($V_{REC}$), then effectively generates a signal indicative of NEXT in decibels (NEXT=20 Log ($V_{REC}/V_{REF}$)).

NEXT measurement circuit 410 suitably comprises a variable frequency (programmable) sinewave signal generator 422, a suitable balanced differential output drive amplifier 424, and a relative signal strength (decibel) measurement circuit 426. Frequency generator 422 suitably generates sinewaves over a predetermined frequency range, e.g., 0.2–20 MHz in, e.g., 100 KHz steps under control of processor control unit 402, which are amplified by amplifier 424 and provided in balanced differential form at terminal 425.

Relative signal strength measurement circuit 426 suitably comprises a conventional log detector 428 Motorola MC13055 Wide Band FSK Receiver, an analog-to-digital converter 430, and a conventional four conductor-to-two conductor multiplexer (MUX) 432, controlled by processor 402. MUX 432 is disposed to alternatively apply the transmitted test signal ($V_{REF}$) at terminal 425 or received signal ($V_{REC}$) at terminal 433 to Log detector 428.

As will be explained, compensating switching interface 420, under control of processor control unit 402, selectively applies the test signals ($V_{REF}$) at terminal 425 to selected pins of connector 20 (corresponding to a first (transmit) pair of conductors), and applies the signals received at the pins of connector 20 (corresponding to a second (receive) pair of conductors) at terminal 433 (for application to circuit 426) of NEXT circuit 410. As will be explained, switching interface 420 selectively connects compensation capacitance between one of the conductors of the transmit pair and one of the conductors of the receive pair to cancel crosstalk attributable to connectors 12 and 20.

Remote unit 18 suitably comprises: a conventional processor for 50 (e.g., a signetics 8052 microcontroller); a suitable frequency generator 452 capable of controllably generating a plurality of discrete frequencies from, e.g., 256 KHz to 20 MHz; a suitable communications interface 454 for facilitating communications between remote unit 18 and test apparatus 16, preferably operating in an asynchronous half duplex mode and capable of operations over any two conductors in the cable; and a compensating interface switching matrix 456, similar to interface 420, but including a mechanism to terminate the selected pairs in their characteristic impedance.

Compensating interface switching matrix 420 suitably comprises matrix of ultra-small polarized relays, for example, AROMAT TQ2E-L2-5V ultra-small polarized relays, configured to operate as electronically controlled single pole, double throw switches. The use of relays, as opposed to silicon switches, is advantageous in that the relays manifest extremely low impedance when in the conductive state, and an extremely high impedance when in nonconductive states.

Figure 5:
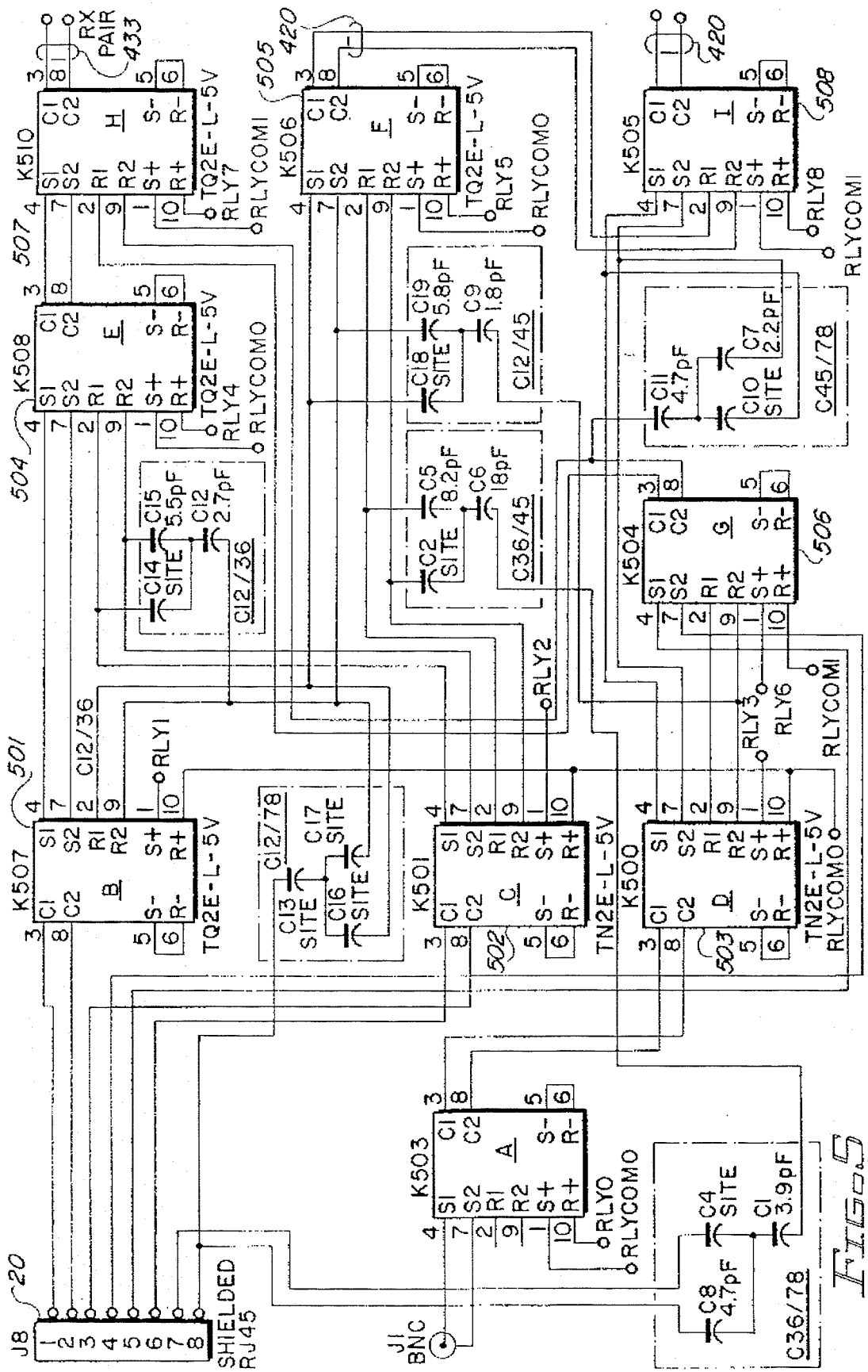
FIG. 5 is a block schematic diagram of a suitable compensating switching interface.

Referring to FIG. 5, interface 420 includes: respective relay switches 501–508, each relay including a pair of pole terminals (C-1, C-2) and respective sets of throw terminals (S-1, S-2; R-1, R-2); and respective capacitances C12/36, C36/45, C12/45, C45/78, and C12/78. Relays 501–508 selectively effect connections between the pole terminals and one or the other of the throw terminals in accordance with signals applied thereto by process control unit 402 (FIG. 4). The capacitances are disposed for selective interconnection into the operative circuit to cancel crosstalk attributable to the near-end connectors (12, 20) and to switching circuit 420.

As shown in FIG. 5, relays 501–508 are interconnected such that selective actuation of different combinations of relays effect application of the test signal from NEXT measurement circuit 410 to a selected transmit conductor pair, apply the signals received on a selected receive conductor pair to NEXT circuit 410 for measurement, and operatively interconnect an appropriate compensation capacitance between the respective selected conductor pairs.

The relay switch states for effecting crosstalk measurement between the respective pairs (1,2/3,6; 1,2/4,5; 1,2/7,8; 3,6/4,5; 3,6/7,8; 4,5/7,8) in the preferred embodiment are shown in Table 2:

TABLE 2

| TRANSMIT /RECEIVE CONDUCTOR PAIRS | SWITCH STATES | | | | | | | |
|---|---|---|---|---|---|---|---|---|
| | 501 | 502 | 503 | 504 | 505 | 506 | 507 | 508 |
| 1,2/3,6 | R | S | R | R | S | S | S | R |
| 1,2/4,5 | R | R | R | S | S | R | R | R |
| 1,2/7,8 | R | R | R | S | S | S | R | R |
| 3,6/4,5 | R | R | R | S | R | R | R | R |
| 3,6/7,8 | R | R | R | S | R | S | R | R |
| 4,5/7,8 | R | S | S | S | R | S | R | S |

For example, to measure crosstalk between conductor pairs 210 (terminals 1,2) and 212 (terminals 3,6), processor 402 generates control signals to connect the pole of switch 401 to its R-throw terminal, the pole of switch 502 to its S-terminal, the pole of switch 503 to its R-terminal, the pole of switch 504 to its R-terminal, the pole of switch 505 to its S-terminal, the pole of switch 506 to its S-terminal, the pole of switch 507 to its S-terminal, and the pole of switch 508 to its R-terminal. Thus, connector pair 210 would be connected from connector 20 terminals 1, 2 through relay switches 501, 505 and 508 to the transmitter output terminals 425 providing balanced differential sinewave signals of predetermined frequency at output terminal 425. Conductor pair 212 is connected from terminals 3 and 6 of connector 20 through switches 502, 504, and 507 to receive terminals 433. It should also be noted that capacitance C12/36 is operatively interconnected between one of the transmit connectors, and one of the receive conductors.

Since the particular arm of the bridge to which capacitance must be added is not initially known, the printed circuit board for switching interface 420 is laid out with a capacitance site to accommodate either instance. In addition, to accommodate instances where the necessary cancellation capacitance is not equal to a standard component value, provisions are made to permit series connections of standard value capacitors to achieve the desired cancellation capacitance. For example, to cancel crosstalk between conductor pairs 210 (terminals 1,2) and 212 (terminals 3,6) sites for three capacitors ($C_{12}$, $C_{14}$, and $C_{15}$) are provided on the circuit board. One end of the site for capacitor $C_{14}$ is connected to the conductor between the $S_1$ output of switch 502 and the $R_1$ output of switch 504 (i.e., connected to conductor 203 of pair 212). One end of the site corresponding to capacitor $C_{15}$ is connected to the conductor between the $S_2$ terminal of switch 502 and $R_2$ terminal of switch 504 (i.e., connected to conductor 204 of pair 212). The other side of the sites for capacitors $C_{14}$ and $C_{15}$ are interconnected, and the cite capacitor $C_{12}$ interposed between the juncture and the conductor between the $R_2$ output of switch 501 and the $S_2$ terminal of switch 505 (i.e., connected to conductor 202 of pair 210). Thus, the interjection of a cancellation capacitor C– between the transmit minus conductor (conductor 202) and receive minus conductor (conductor 204) (in analogy to the bridge shown in FIG. 3A) is accommodated by connecting capacitors $C_{12}$ and $C_{15}$ into the operative circuit (the site for capacitor $C_{14}$ is left vacant. Conversely, if a cancellation capacitance ($C_+$) was required between the transmit plus and receive plus conductors (conductors 201 and 203, in this instance), a capacitor would be connected into site $C_{14}$, and site $C_{15}$ would be left vacant, and hence open.

In practice, the values of the cancellation capacitances are determined empirically. It has been found that, because of the standardized configuration of the RJ45 modular jack connector and fixed crosstalk contributions from the relay and printed circuit board, the values of the respective cancellation capacitances tend to be approximately the same (within 10%–15%) from connector to connector. Such standard values are shown in Table 3:

TABLE 3

| CANCELLATION CAPACITOR | VALUE | C+/C– |
|---|---|---|
| $C_{12/36}$ | 1.8 pf | C– |
| $C_{12/45}$ | 1.4 pf | C– |
| $C_{12/78}$ | 0 | |
| $C_{36/45}$ | 6.4 pf | C+ |
| $C_{36/78}$ | 2.1 pf | C– |
| $C_{45/78}$ | 1.5 pf | C– |

Employing two capacitors in series (e.g., capacitors $C_{12}$ and $C_{15}$) to form the desired capacitance accommodates the implementation of nonstandard capacitance values with standard components. For example, as shown in Table 3, capacitance $C_{12/36}$ has a desired value of 1.8 picofarads, which is implemented by a 2.7 picofarad capacitor $C_{12}$ in series with 5.5 picofarad capacitor $C_{15}$.

Integrating the capacitance into the relay matrix for selecting the transmit and receive pairs is additionally advantageous in that the cancellation capacitor cancels not only crosstalk attributable to the connector (12, 20) but also crosstalk due to the relay matrix and printed circuit board routing.

Figure 6:
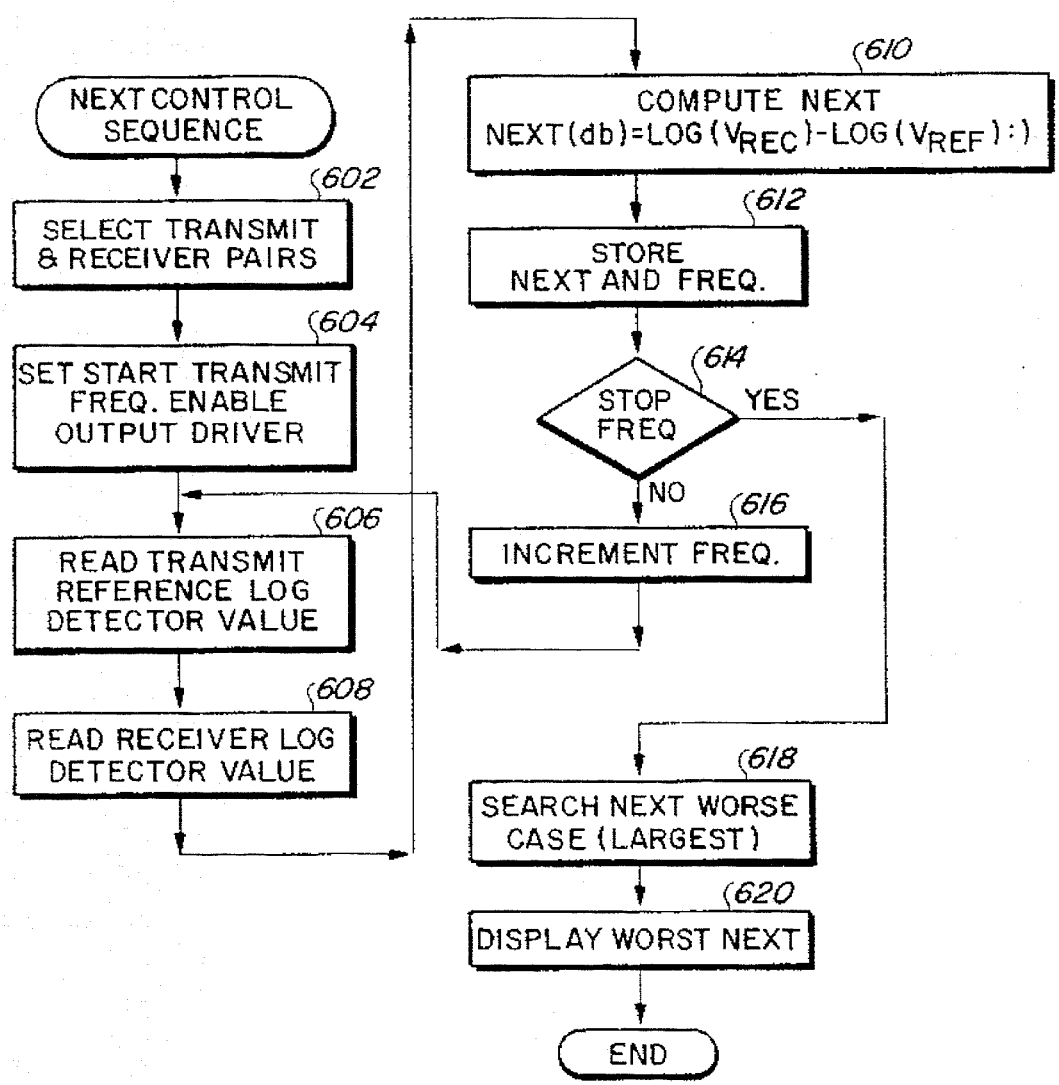
FIG. 6 is a flow chart of the NEXT measurement process.

Referring now to FIG. 6, in effecting the near-end crosstalk measurement, processor control unit 402 generates control signals to relay switches 501–508 in accordance with Table 2 to connect the selected transmit and receive pairs to NEXT measurement circuit 410 (step 602). Processor control unit 402 then generates the appropriate control signals to set signal generator 422 at an initial frequency, and enable output drive amplifier 424 (step 604). Multiplexer 432 applies a sample of the transmitted signal to log detector 428, which generates a reference log value for digitization by A/D converter 430, and temporary storage in processor control unit 402 (step 606). Processor control unit 402 then generates a signal to toggle multiplexer 432 to apply the signal received on the selected receive pair to log detector 428, which generates a log signal for digitization by A/D converter 430 and storage by processor control unit 402 (step 608). Processor 402 then computes the near-end crosstalk value (step 510):

$$NEXT(dB)=LOG(V_{REC})-LOG(V_{REF})$$

The near-end crosstalk value, and frequency at which it was measured, are then stored (step 612) and the frequency tested against the upper bound of the test frequency range (step 614). Assuming that the upper limit has not been reached, the frequency is incremented by a predetermined step (e.g., 100 KHz), and steps 606, 608, 610, 612 and 614 are repeated. When the upper limit frequency is attained, a search for the worst case near-end crosstalk value is effected (step 618), and indicia of the worst NEXT case value provided on display 414.

As previously noted, the insertion of a cancellation capacitor into the operative circuit, in effect, injects an out-of-phase signal to cancel the connector crosstalk. Alternative methods of canceling the connector crosstalk can also be employed.

One alternative is to determine the magnitude and phase (relative to the transmit (test) signal), i.e., the in-phase and quadrature components, of the connector crosstalk at each of the incremental test frequencies, store the values in a lookup table and effect a vector subtraction from the received signal. Since the crosstalk is due in main part to standardized physical aspects of the connector, the magnitude and phase of connector crosstalk would be approximately the same for all of the connectors of the standard configuration and can be empirically determined (measured). The magnitude and phase relative to the transmit (test) signal, i.e., the in-phase and quadrature components, of the received signal can then be detected, and the stored value of the in-phase and quadrature components of the connector crosstalk subtracted from the corresponding component of the received signal to cancel signal components due to connector crosstalk.

As illustrated schematically in FIG. 7, the crosstalk ($V_{NXT}$) generated in the receive pair comprises an in-phase component ($I_{NXT}$) and a quadrature component ($Q_{NXT}$), with reference to the transmit (test) signal. Additional crosstalk is interjected ($V_{CON}$) into the system through the RJ45 connector (12,20) and, to a lesser extent, a (conventional uncompensated) switching matrix. The received signal ($V_{REC}$) presented to the NEXT detector circuit 410 at terminal 433 comprises the vector sum of the cable crosstalk $V_{NXT}$ and connector crosstalk $V_{CON}$.

Figures 8, 10:
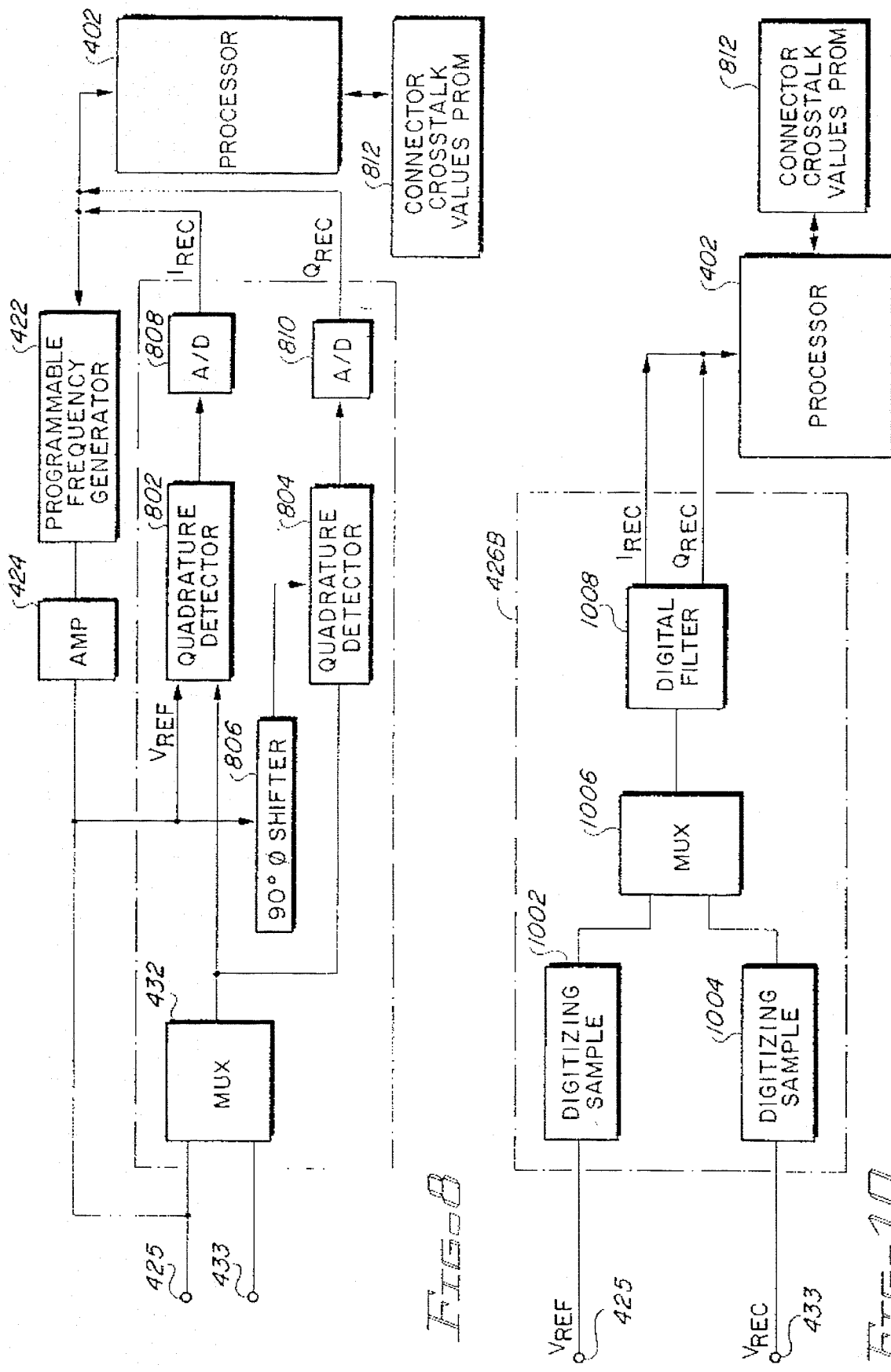
FIG. 8 is a block schematic diagram of an alternative near-end crosstalk measurement circuit including connector crosstalk cancellation.
FIG. 10 is a block schematic diagram of a relative strength measurement circuit utilizing digital processing techniques.

Referring now to FIG. 8, the uncompensated received signal ($V_{REC}$) is applied to an alternative relative signal strength measurement circuit 426A comprising: multiplexer 432; respective conventional quadrature detectors 802 and 804; a 90° phase shifter 806; and conventional analog to digital converters 808 and 810. The uncompensated received signal is applied through multiplexer 432 to quadrature detectors 802 and 804. Quadrature detector 802 is also receptive of a sample of the transmit (test) signal ($V_{REF}$), and generates a signal indicative of the in-phase component of the received signal ($I_{REC}$), which is digitized by an analog digital convertor 808 and communicated in a conventional manner to processor 402. A sample of the transmit (test) signal is also applied through a 90° phase shifter 806 to quadrature detector 804. Quadrature detector 804 thus generates a signal indicative of the quadrature component ($Q_{REC}$) of the received signal, which is digitized by an analog to digital convertor 810 and communicated in a conventional manner to processor 402.

In operation, multiplexer 432 alternately applies a sample of the transmit (test) signal ($V_{REC}$) and the uncompensated received signal ($V_{REC}$) to quadrature detector 802 and 804 to facilitate computation of near-end crosstalk [NEXT=20 LOG ($V_{REC}/V_{REF}$)]. Compensation is effected by subtracting predetermined in-phase and quadrature components of the connector crosstalk from the corresponding components of the received signal. More specifically, predetermined in-phase and quadrature components of connector crosstalk ($I_{CON}$, $Q_{CON}$) for each incremental test frequency are stored in a conventional programmable read only memory 812. Referring to FIG. 9, in operation, after the transmit and receiver pairs are selected, programmable frequency generator 422 initialized, and amplifier 424 enabled (see FIG. 6), processor 402 generates signals to multiplexer 432 to apply a sample of the transmit signal to quadrature detectors 802 and 804, to generate indicia of the reference voltage $V_{REF}$ for the NEXT calculations (step 910) (the output of quadrature detector 804 is 0). Control signals are then generated to MUX 432 to apply the received signal (provided at terminal 433) to quadrature detectors 802 and 804. The in-phase ($I_{REC}(f)$) and quadrature ($Q_{REC}(f)$) components are then read (step 912). Assuming that connector crosstalk is to be canceled, the connector crosstalk in-phase ($I_{CON}(f)$) and quadrature ($Q_{CON}(f)$) components for the instantaneous test frequency are retrieved from PROM 812, and indicia of the cable crosstalk ($V_{NEXT}$) calculated (step 916):

$$V_R=V_{NEXT}=[(I_{REC}(f)-I_{CON}(f))^2+(Q_{REC}(f)-Q_{CON}(f))^2]^{1/2}$$

The NEXT value in decibels for the transmit frequency is then calculated (step 918) and stored together with indicia of the instantaneous frequency (step 920). The frequency is then checked against the maximum test frequency (step 922). Assuming that the maximum frequency has not been attained, the frequency is incremented (step 924) and the sequence repeated. Provisions can be made for selectively effecting compensation for connector crosstalk. If desired, a check of an operator set parameter (e.g., a flag) can be made (step 914). If the cancellation option is not chosen, the in-phase and quadrature components of the received signal can be combined without subtracting the connector crosstalk components (step 926) and that figure used in the NEXT calculation.

Any technique for developing the in-phase and quadrature components of the received signal may be employed. For example, standard digital signal processing techniques may be utilized. Referring to FIG. 10, an alternative relative strength measurement circuit 426B utilizing digital signal processing suitably comprises respective conventional digitizing samples 1002 and 1004, a conventional multiplexer (MLX) 1006 and a suitable digital filter 1008 for generating indices of the in-phase and quadrature components of the applied signals.

It should be appreciated that the present invention provides a particularly advantageous mechanism for accurately certifying a cable in high speed data communication systems. Cancellation of the connector crosstalk permits the test instrument to accurately measure the NEXT characteristic of the cable. In addition, cancellation of connector crosstalk provides for more accurate measurement of attenuation, when the loop back method is employed. The embodiment of the invention employing cancellation capacitors integral to the relay matrix is also particularly advantageous in that the relay matrix not only provides the required switching paths for performing NEXT measurements on six pair combinations, but also achieves the desired selective interposition of cancellation capacitors, without requiring additional relays. The embodiment employing subtraction of predetermined in-phase and quadrature components of connector crosstalk is particularly advantageous for its flexibility.

It will be understood that while various of the connections between elements are shown in the drawing (and in particular FIGS. 4 and 8) as single lines, they are not so shown in a limiting sense, and comprise plural conductors or connections as is understood in the art. Similarly, power connections, various control lines and the like to the various element are, in many instances, omitted from the drawing for the sake of clarity. Further, the above description is of preferred exemplary embodiments of the present invention, and the invention is not limited to the specific form shown. Modifications may be made in the design and arrangement of the elements within the scope of the invention, as expressed in the claims.

We claim:

1. Apparatus for measuring near end crosstalk between first and second pairs of conductors in a multiconductor cable terminated in a connector at said near end, said apparatus comprising:

first means for selectively transmitting a signal having a predetermined time/frequency domain characteristic on said first pair of conductors;

second means for receiving signals having said predetermined time/frequency domain characteristic present on said second pair of conductors, compensating for crosstalk in said near end connector, and generating indicia of near end crosstalk between said pairs of conductors.

2. A method of measuring near end crosstalk between first and second pairs of conductors in a multiconductor cable terminated in a connector at said near end, said method comprising the steps of:

transmitting a signal having a predetermined characteristic on said first pair of conductors;

receiving signals having said predetermined characteristic present on said second pair of conductors;

compensating for crosstalk in said near end connector; and generating indicia of near end crosstalk between said pairs of conductors.

3. The method of claim 2 further including the step of terminating the far end of said cable pairs in their characteristic impedance.

4. A system for testing predetermined characteristics of a multiconductor cable including at least first and second pairs of conductors and terminated at the cable near end in a cable near end connector and at the cable far end in a cable far end connector, said system comprising a near end unit and a far end unit, said near end unit comprising:

a processor;

measurement circuits corresponding to said predetermined characteristics of the multiconductor cable:

a unit near end connector configured to mate with said cable near end connector;

an interface circuit, responsive to control signals applied thereto, for selectively coupling said measurement circuits to said pairs of conductors through the unit near end connector and cable near end connector;

means for compensating for crosstalk in said near end connectors; and a display, cooperating with said measurement circuits for generating indicia of the predetermined characteristics; and said far end unit comprising:

a processor;

a unit far end connector configured to mate with said cable far end connector;

an interface circuit, responsive to control signals from said near end unit applied thereto through said multiconductor cable, for selectively effecting connections to said pairs of conductors through the unit near end connector and cable near end connector; and means for compensating for crosstalk in said far end connectors.

5. The apparatus of claim 4, wherein said second means includes means for effecting a vector subtraction of said crosstalk in said near end connectors from signals received through said second pair of conductors to compensate for crosstalk in said near end connector.

6. A far end unit, for use in a system for testing predetermined characteristics of a multiconductor cable including at least first and second pairs of conductors and terminated at the cable far end in a cable far end connector, said system comprising a near end unit and a far end unit, said near end unit including measurement circuits corresponding to said predetermined characteristics of the multiconductor cable and a processor for generating control circuits, said far end unit comprising:

a processor;

a unit far end connector configured to mate with said cable far end connector;

an interface circuit, responsive to control signals from said near end unit applied thereto through said multiconductor cable, for selectively effecting connections to said pairs of conductors through the unit near end connector and cable near end connector; and means for compensating for crosstalk in said far end connectors.

7. The apparatus of claim 6, wherein said second means includes means for effecting a vector subtraction of said crosstalk in said near end connectors from signals received through said second pair of conductors to compensate for crosstalk in said near end connector.

* * * * *